United States Patent [19]

Piwczyk

[11] Patent Number: 4,801,352
[45] Date of Patent: Jan. 31, 1989

[54] FLOWING GAS SEAL ENCLOSURE FOR PROCESSING WORKPIECE SURFACE WITH CONTROLLED GAS ENVIRONMENT AND INTENSE LASER IRRADIATION

[75] Inventor: Bernhard Piwczyk, Carlisle, Mass.

[73] Assignee: Image Micro Systems, Inc., Billerica, Mass.

[21] Appl. No.: 209

[22] Filed: Dec. 30, 1986

[51] Int. Cl.$^4$ .................... B44C 1/22; C03C 15/00; B05D 3/06; B23K 9/00

[52] U.S. Cl. .................... 156/643; 118/729; 118/50.1; 118/620; 156/646; 156/345; 156/668; 427/53.1; 427/54.1; 427/248.1; 219/121.69; 219/121.85; 219/121.84; 219/121.61

[58] Field of Search ........... 156/345, 643, 646, 659.1, 156/655, 656, 657, 662, 668; 427/248.1, 43.1, 53.1, 54.1, 272; 118/729, 50.1, 620; 219/121 LM, 121 FS, 121 LY, 121 LH, 121 LJ, 121 LA, 121 LU; 430/296, 313, 315, 317, 318, 945

[56] References Cited

U.S. PATENT DOCUMENTS

| | | | |
|---|---|---|---|
| 4,414,059 | 11/1983 | Blum et al. | 430/326 X |
| 4,478,677 | 10/1984 | Chen et al. | 156/345 X |
| 4,534,816 | 8/1985 | Chen et al. | 156/345 X |
| 4,544,446 | 10/1985 | Cady | 156/639 |

Primary Examiner—William A. Powell
Attorney, Agent, or Firm—Robert T. Dunn

[57] ABSTRACT

A controlled gas environment is provided against a surface area of a semiconductor wafer for performing processes on the area in the fabrication of integrated circuits thereon, including processes of deposition, impurity implantation, etching, ablation, and other radiation induced chemical processes involving the gas atmosphere by maintaining a continuous gas flow over the area and a portion of the surrounding area of the wafer surface covered by an enclosure that is suspended on the surface on a film of the flowing gas, the pressure, temperature and composition of the gas atmosphere against the surface area being controlled to meet the requirements of each processing step and/or to carry away particles while the gas seal is maintained. In a particular embodiment, intense ultraviolet (UV) laser radiation is focused by an optical system on a target on the semiconductor wafer surface through the suspended enclosure while the wafer is held on a table that moves in the plane of the wafer surface in order to expose different selected areas of the surface to the combined effects of the UV radiation and the gas atmosphere.

56 Claims, 6 Drawing Sheets

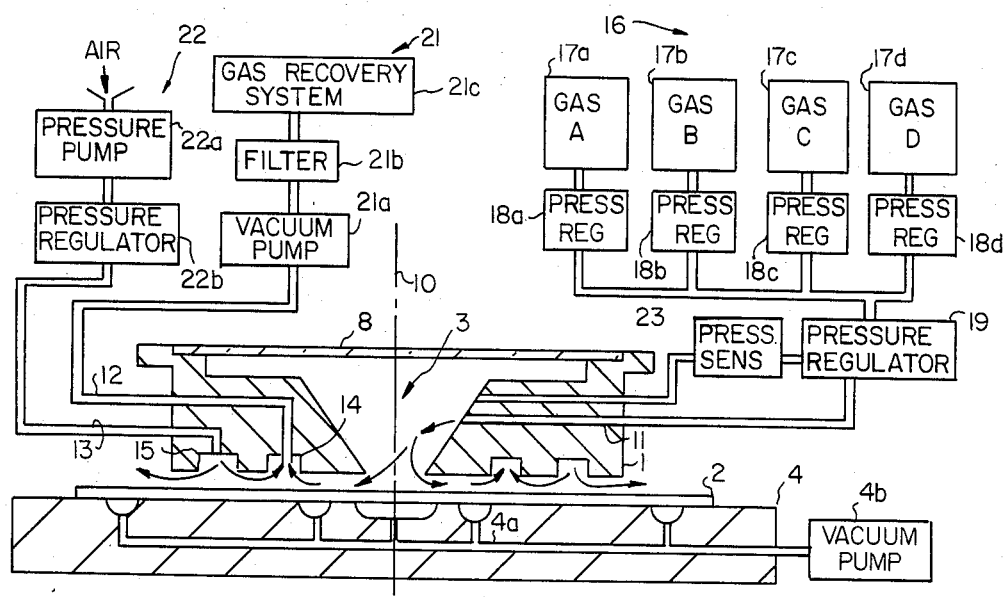
FIG. 3
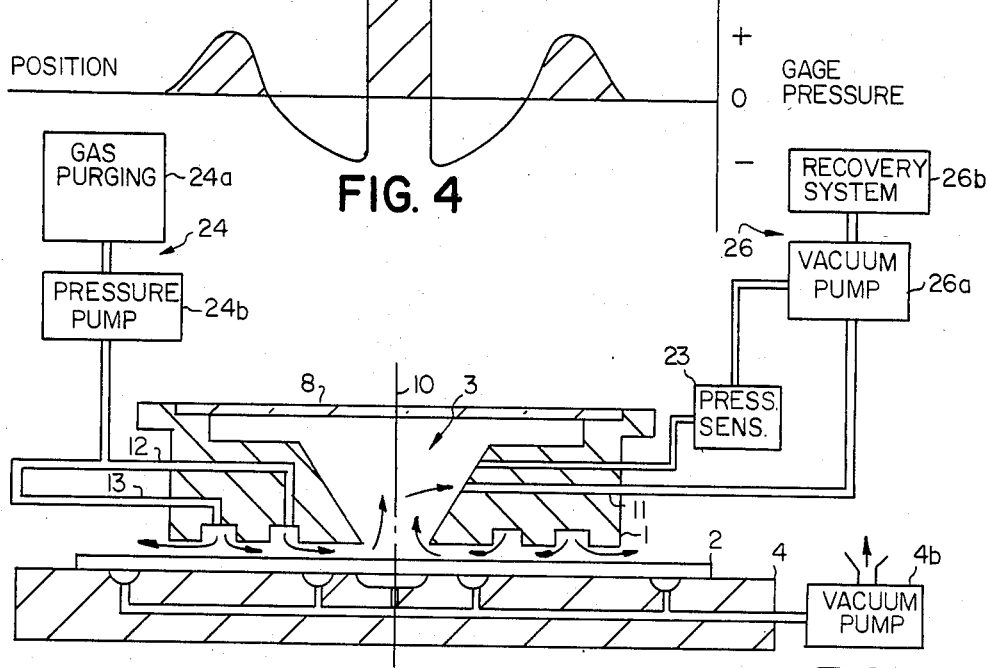
FIG. 4
FIG. 5
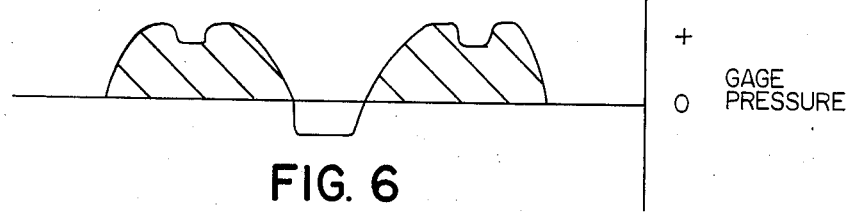
FIG. 6

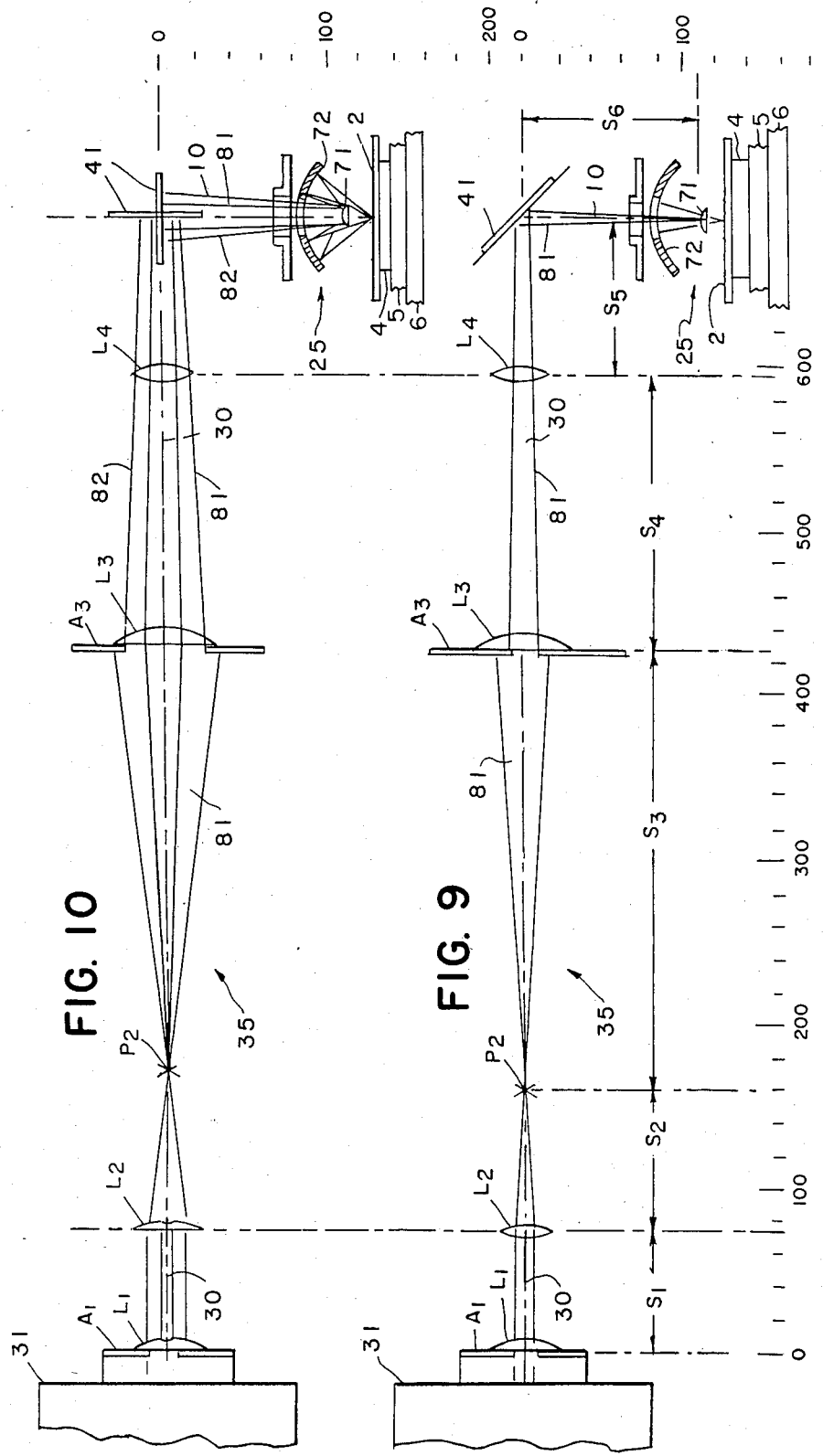

FLOWING GAS SEAL ENCLOSURE FOR PROCESSING WORKPIECE SURFACE WITH CONTROLLED GAS ENVIRONMENT AND INTENSE LASER IRRADIATION

BACKGROUND OF THE INVENTION

This invention relates to methods and means of providing a controlled gas environment against a workpiece surface, and in particular for providing a controlled gas atmosphere against a selected area of a semiconductor wafer surface of controlled temperature, pressure and composition to which the wafer can be introduced, processed and removed while in an ambient environment, without immersing the entire wafer in the gas environment and encountering the attendant difficulties of opening and closing static gas seals.

The invention has particular application to some of the gas (dry) processes in the fabrication of integrated circuits including processes of deposition, impurity implantation and other gaseous chemical processes and laser induced gaseous processes such as ablative photodecomposition (APD). A specific embodiment of the invention described herein includes gas flow controls to maintain a flowing gas seal against the surface of the wafer while maintaining the desired gaseous conditions within the seal at the selected processed area of the wafer, for radiation induced processes like deposition, impurity implantation, ablation and others and to carry away any particles or gaseous by products produced by the process and used process gas.

Photolithography Using Photoresist Film

Heretofore, semiconductor fabrication photolithography processes have used light beams, electron beams, x-rays and ion beams to expose fine patterns of a mask on a photoresist film on the doped surface of a thin semiconductor wafer substrate. The photoresist is then developed with a liquid solvent that removes the unexposed (or the exposed) photoresist, baring the semiconductor surface for the nett step, which may be, for example, etching with liquid chemicals. This process is called photolithography and is part of the wet (liquid chemical) processing steps used in the fabrication of integrated circuits on the wafer. Successive processes like this use other masks to expose other fine patterns on new films of photoresist and in this way an array of integrated circuits are formed layer by layer on the wafer substrate.

In these efforts, the shorter wavelength radiation is sought, because it enables greater resolution. This consideration has promoted interest in using deep or far ultraviolet radiation, defined as the 150 to 400 nanometers (nm) wavelength. These sources of far ultraviolet radiation include mercury or deuterium lamps and excimer lasers. Excimer lasers are ideal, because they produce pulses of sufficient intensity for ablative photodecomposition (APD) and all other radiation induced processes and they lack good spatial coherence within the laser beam, as the laser is multimode. The lack of good spatial coherence means that the wave lengths of the laser beam will not interfere constructively or destructively at the wafer photoresist surface, and so will not produce nonuniform exposures as a consequence of "speckle".

In all of these wet photolithography processes, a photoresist film is exposed by a beam through a mask and the intensity of the beam on the photoresist need only be great enough to induce the chemical reaction in it (usually polymerization or depolymerization) to make it insoluble in a liquid solvent developer that disolves the photoresist which is not so exposed.

The wet processes including wet photolithography processes require flooding the semiconductor wafer surface with a liquid under controlled conditions and time calculated to accomplish the process. The process is terminated by removing the liquid by either spinning it off or removing the wafer from a bath of the liquid. This may be followed by rinsing the wafer with another liquid. Either way there must not be any residue of the liquids left on the wafer and particular steps and handling techniques must follow to insure this.

It is another object of the present invention to provide a method and means of accomplishing at least some if not all of the precessing steps of a semiconductor wafer in the manufacture of integrated circuits on the wafer that are dry processes.

Processes Requiring Laser Radiation

Photochemical reactions at the surface of a semiconductor can be induced by a laser beam directed to the surface. In some cases, the laser beam simply heats the surface to induce the chemical reaction. This is called pyrolitic reaction. Other reactions are induced by photons directly effecting chemical bonds. This is called photolitic reaction. These processes include gas phase operations such as plasma etching and chemical vapor deposition.

Ablative photodecomposition (APD) is a phenomenon observed at the surface of, for example, an organic polymer chemical compound (this includes many photoresist materials) to which far ultraviolet laser pulses are directed, for which the fluence of a pulse exceeds a threshhold. At low far ultraviolet light intensity, such as from a mercury lamp, material may be oxidized at a significant rate from the irradiated area of the surface in the presence of air or oxygen. At higher far ultraviolet light intensity, such as produced by a far ultraviolet laser, the APD process becomes operative to a depth controlled by the radiation absorption capability of the irradiated material. APD is a photolitic reaction.

According to the APD process, the energy of a far ultraviolet photon is sufficient to exceed the bond dissociation energy of some chemical bonds. Beyond that, the excess energy of the photon above the bond dissociation energy resides in the fragments of the dissociation as translational rotational and vibrational energy. As a result, the products of ablative photodecomposition are ejected from the surface of the film or "ablate." and there is very little or no heating of the substrate. Furthermore, the material ablates layer by layer as successive pulses of the far ultraviolet radiation are directed to it. The result of this ablation process is often a clean well defined pit, and each pulse removes about the same amount of material. Hence, the depth of the pit (or etch by radiation) can be rather precisely controlled by metering the fluence and the number of the pulses.

The ejected products of APD and larger particulates spauled off in the process may have to be removed immediately. It is an object of the present invention to provide a method and means of performing APD processes on the wafer whereby all of such ejected products and particulates are immediately removed.

In all of the above described uses of far ultraviolet laser radiation pulses, produced almost exclusively by excimer or YAG lasers, the problem arises of focusing the laser pulses on a target area of the semiconductor wafer surface to produce a required intensity at the target (pulse fluence). A conventional refractive lens optical system for focusing to increase the pulse fluence is not suitable for several reasons. For example, a refractive lens focal length varies with wavelength and so a system of refractive lenses must be adjustable for different wavelength radiation; and in many cases refractive lenses cannot withstand the hgh fluence laser pulses they must transmit. A suitable reflective optics objective lens system avoids these problems. Such a lens system for focusing intense far ultraviolet laser pulses on a target is described in copending U.S. patent application, Ser. No. 864,448, filed 5/16/86 entitled Intense Laser Irradiation Using Reflective Optics, by Bernhard Piwczyk (the inventor in the present application) and is assigned to the same assignee as the present application and is presently pending in the U.S. Patent and Trademark Office.

It is another object of the present invention to provide a method and means of improving radiation induced processes of deposition, impurity implantation and etching from a gas medium at a surface of a semiconductor wafer in the manufacture of integrated circuits on the wafer. It is another object to provide a method and means of improving APD processes at the surface of a semiconductor wafer in the manufacture of integrated circuits on the wafer.

Flowing Gas Seal On Wafer Surface

In any processing of a semiconductor wafer in the manufacture of integrated curcuits on the wafer that requires vaccuum or a particular gaseous environment at the wafer surface, it is preferred that the wafer be introduced to the environment and the environment be changed without encountering the difficulties of opening and closing gas seals as is done when the wafer is entirely immersed in the gas environment. A technique has been disclosed for direct write on a semiconductor wafer surface with an E-beam where the beam and wafer surface are in vacuum, the E-beam vacuum enclosure making a flowing gas seal around the vacuum against the wafer surface. That technique was presented at (SPIE) International Society for Optical Engineering Conference in March 1985 by P. F. Petric and J. A. Schoeffel. According to that technique the flowing gas seal, called a "microseal vaccuum interface" consists of three cones of which the smaller ends are truncated and coplanar and attached to the bottom of the E-beam enclosure. The annular spaces between the cones are pumped by successive vaccuum stages of which the last stage purges the E-beam enclosure. Thus, this "microseal" technique provides a vacuum environment only, at the wafer surface for carrying out E-beam processes on the surface of the wafer.

It is another object of the present invention to provide an improved method and apparatus of producing a gas environment at a surface of a semiconductor wafer in which the composition, temperature and pressure of the gas are readily controlled for carrying out processes on the wafer surface involving the gas.

It is another object to provide such an improvement without encountering the difficulties of opening and closing vacuum and gas seals when the wafer is inserted into the apparatus for processing and removed from the apparatus.

It is another object to provide such apparatus that seals to an area of the wafer surface to be processed providing a sealed processing chamber at that area that can be filled with gas of controlled composition, temperature and pressure without touching the surface and while the wafer is held in an ambient environment such as air.

SUMMARY OF THE INVENTION

In its broadest application, the present invention provides a controlled gas environment against a selected area of a surface of a workpiece for processing that area of the surface, without immersing the entire workpiece in the gas environment. The embodiments described herein provide a controlled gas environment against a selected area of a surface of a semiconductor wafer in performance of processes in the fabrication of integrated circuits, including processes of deposition, impurity implantation, etching, ablation and other radiation induced chemical processes. The gas environment is maintained by the continuous flow of gas over the selected area and a portion of the surrounding area of the wafer surface being processed, covered by an enclosure suspended a few microns above the wafer surface on a film of the flowing gas that forms a flowing gas seal between the enclosure and the wafer surface. In operation, the pressure, temperature and composition of the gas in the enclosure against the processed area of the wafer surface are controlled to meet the requirements of each processing step and/or to carry away particulates that result from the process and to maintain the gas seal.

In a preferred embodiment, intense ultraviolet (UV) radiation is focused by an optical system through the suspended enclosure on a target in the area being processes while the wafer is held on a table that shifts the wafer in the plane of its surface (along the UV optical system X and Y axes) in order to expose different areas of the surface to the combined effect of the UV radiation and the gas environment. The flowing gas that effects the seal between the wafer surface and the suspended enclosure determines the gap, G, therebetween that is measured along the system Z axis which is the optical axis of the UV optical system through the focal point of the UV radiation. In addition, the table may also shift the wafer along the system Z axis and, depending upon which parts are fixed to mechanical ground and which parts are suspended, between variations of G and table shifts along the Z axis, the wafer surface may be brought to the point of focus of the laser radiation so that the wafer surface tracks the point of focus.

According to another feature of the present invention, pulses of far UV radiation from an excimer laser are focused on the target area on the surface of the wafer through a window in the suspended enclosure using a reflecting objective lens system immediately opposite the window for increasing the fluence of the far ultraviolet laser pulses and focusing the pulses on the target. This objective lens system is oriented with its optical axis essentially normal to the plane of the wafer surface and all beam focusing optical surfaces in it are reflecting and formed by coatings of materials that are entirely suitable for producing high reflectance of the far ultraviolet wavelength substantially as described in said U.S. patent application Ser. No. 864,448.

The seal face against the wafer surface to be processed has several concentric annular grooves and gas feeds to or from these grooves and to or from the process chamber are coordinated to provide the desired gas environment in the chamber against the processed area of the wafer surface and to provide the flowing gas seal radially outward from the chamber. This is done by controlling the gas pressures and flow rates and direction at each feed. By these controls, a given gas environment is maintained in the chamber, or the chamber is purged by gas to carry away particles and byproducts of the process.

These and other features and objects of the present invention are apparent from the following specific description of embodiments of the invention taken in conjunction with the figures.

DESCRIPTION OF THE FIGURES

FIG. 3 is a side cross section view of the flowing gas seal enclosure and the wafer and vacuum chuck that holds the wafer at its bottom surface illustrating operation to produce a controlled gas environment in the enclosure against the area of the top surface of the wafer to be processed;

FIG. 4 shows plots of gas pressures along a diametrical line across the flowing gas seal gap G for the operation illustrated in FIG. 3;

FIG. 5 is a side cross section view of the flowing gas seal enclosure and the wafer and vacuum chuck that holds the wafer at its bottom surface, illustrating operation to produce a purging gas flow through the enclosure to carry away from the wafer surface gases and particulates produced in a process such as ablative photodecomposition (APD);

FIG. 6 shows plots of gas pressures along a diametrical line across the flowing gas seal gap G for the operation illustrated in FIG. 5;

FIG. 9 is an optical diagram of the same optical system shown in FIGS. 7 and 8 as viewed from the side showing the rays of laser radiation and the relative positions of optical parts of the laser optical system including the optical detector for detecting the Z axis position of the wafer, the wafer Z axis actuator stage and feedback to the Z axis actuator from the detector to position the wafer target surface at the radiation focus;

FIG. 10 shows the same optical and other parts and rays of laser radiation as shown in FIG. 9, but viewed from the top to show the split beams of laser radiation and how they are directed to the reflecting objective lens system for focusing on the target area of the wafer and the Z axis actuator that responds to the wafer Z axis optical detector;

EMBODIMENTS OF THE INVENTION

Figure 1:
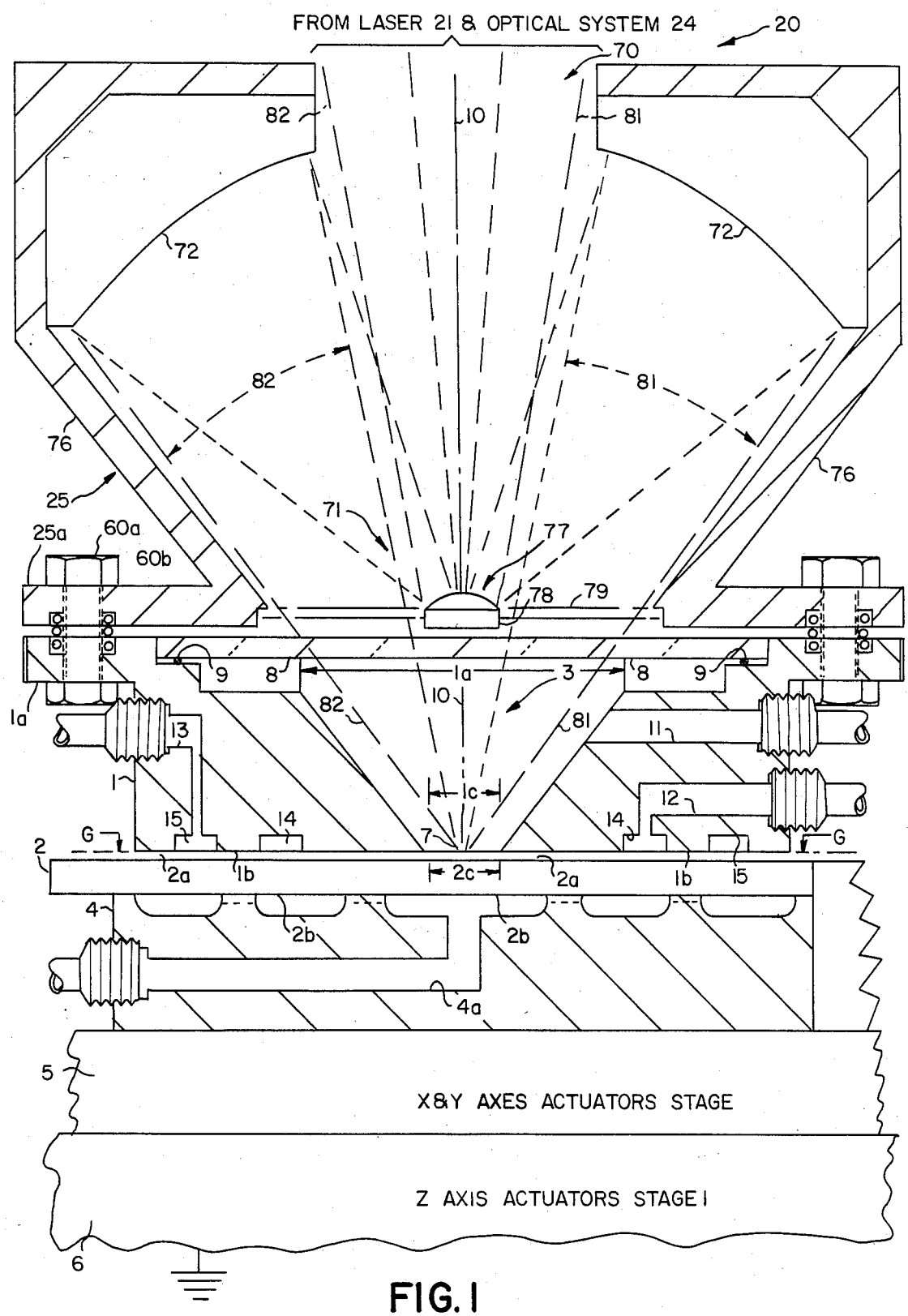
FIG. 1 is a side partially cross section view of an embodiment of the invention where part of the semiconductor wafer surface is covered by the flowing gas seal enclosure that is transparent to far ultraviolet (UV) radiation and a reflecting objective lens system of an excimer laser optical system focuses the laser pulses on the target area of the wafer surface in the enclosure while the wafer is held by Z axis staging that positions the wafer relative to the UV objective lens system to position the target area at the UV focal point.
Figure 2:
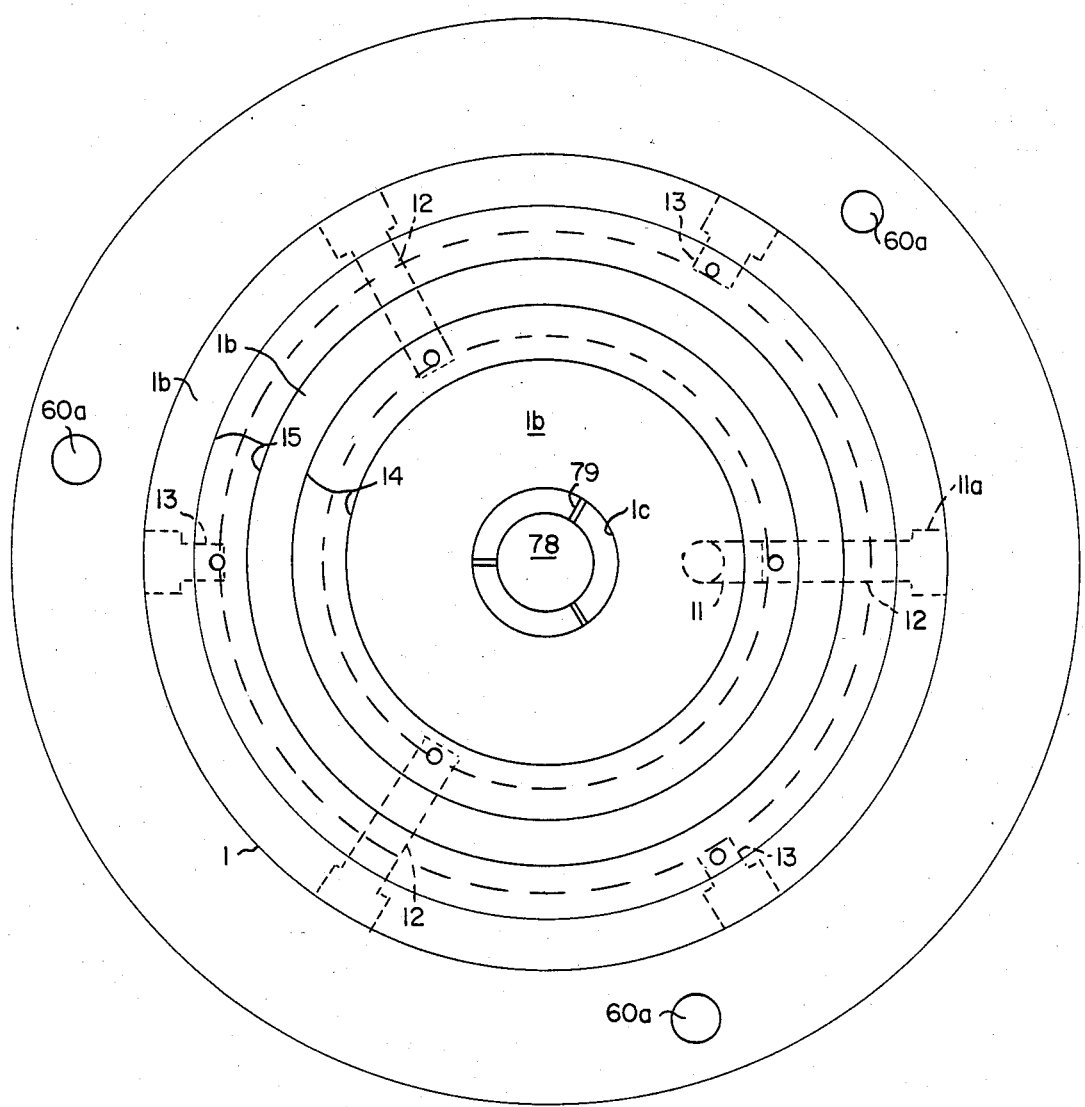
FIG. 2 is a bottom view of the flowing gas seal enclosure showing in particular the parts thereof that are opposed the surface of the wafer (top surface) to be processed.

The embodiment of the invention shown particularly in FIG. 1 applies intense far ultraviolet laser radiation to an enclosed area of the top surface of a semiconductor wafer over which controlled gas flows. The structure in this embodiment is used to carry out processes or reactions on the wafer surface in the fabrication of integrated circuits thereon, including processes of deposition, impurity implantation, etching, ablation and other radiation induced chemical processes wherein the gas environment at the wafer surface is maintained by continuous gas flow through a flowing gas seal enclosure that is suspended a few microns above the wafer surface and flowing gas therebetween forms a gas seal between the enclosure and the wafer surface, sealing the wafer processing chamber at the enclosed area (target area) of the wafer surface. The gap G between the annular rim of the enclosure that is parallel to the wafer surface and the wafer surface is adjusted to maintain the seal, while controlled gas is fed to the processing chamber to meet the requirements of the processing step and/or to carry away particles and gas from the wafer surface that result from the processing.

Wafer Platform, Gas Seal, Chamber And Irradiation System

The wafer is held by a holder on a platform that shifts the wafer in the plane of its (the wafer's) surface in order to expose different areas of the surface for processing. This shifting is along the irradiation optical system X and Y axes. The gap G between the wafer surface and the seal of the suspended enclosure varies slightly as the flowing gas pressure varies. When that pressure increases, G increases as necessary to adjust the gap G between the wafer surface and the suspended enclosure to maintain proper flow of the gas therebetween. These changes in G as well as changes in the gas environment in the processing chamber in the suspended enclosure may defocus the radiation and so are detected as focus shifts and are used either to shift the point of focus of the laser radiation or to move the wafer along the Z axis, or both, so that the radiation is focused on the surface.

Pulses of far ultraviolet radiation from an excimer laser are directed by an optical system and focused on the target area on the surface of the wafer through a window in the suspended enclosure using a reflecting objective lens system immediately opposite the window for increasing the fluence of the far ultraviolet laser pulses and focusing the pulses on the target. The preferred orientation of this objective lens system is with its optical axis (the Z axis) normal to the plane of the wafer surface. Furthermore, the objective lens system is reflective for reasons already mentioned and described more fully in said co-pending U.S. patent application Ser. No. 864,448.

The principal features of the present invention are illustrated in FIG. 1 which is a side cross section view taken through the Z axis which is the optical axis 10 of the irradiation system 20. The flowing gas seal enclosure 1 is suspended on the surface of semiconductor wafer 2, the gap G between the bottom surface 1b of the enclosure and the top surface 2a of the wafer forming the flowing gas seal. The enclosure provides the wafer surface processing chamber 3 along optical axis 10 at the processed area 2c of the wafer top surface 2a.

The seal assembly 8 includes suspended enclosure 1, the inserted wafer 2 and vacuum chuck 4. The wafer is held at its bottom surface 2b by vacuum chuck 4, which is mounted on the X and Y axes actuators stage 5, which is mounted on the Z axis actuator stage 6 which is mounted to mechanical ground. The Z axis actuator of stage 6 positions the wafer along the Z axis which is the same as the optical axis 10 of the irradiation system and the X and Y actuators position the wafer along the X and Y axes. This apparatus is shown in its usual upright position where the optical axis 10 and the Z axis are vertical and the radiation enters from above.

Vacuum chuck 4 holds the wafer at its bottom surface 2b by suction and so it flattens the wafer. The vacuum of chuck 4, in the passages 4a thereof, is maintained by vacuum pump 4b. That vacuum is at many points against the bottom of the wafer, and at all times lower pressure than the average pressure on top of the wafer surface 2a; and so there is no likelihood that the flowing gas seal pressures or the enclosure processing chamber 3 pressures will fall below the chuck vacuum and tend to lift it off the chuck.

Processing gas can only exist in chamber 3, gap G, annular grooves 14 and 15 and in the gas flow passages 11, 12 and 13 that feed gas to or from the chamber and the channels and sources of the gas. Seal enclosure 1 may be connected to the laser objective lens system 25 for alignment therewith. That connection may be rigid or it may allow relative movement along the Z axis; or, for some applications, there may be no restrictive connection between seal enclosure 1 and objective lens system 25 and each may be independantly moved along the Z axis.

In this embodiment, enclosure 1 and objective lens system 25 are attached with some latitude of movement between them permitted along the Z axis. Here, objective lens system 25 is at mechanical ground, as is Z axis actuator stage 6, and the enclosure and objective lens system are attached at their adjacent flanges 1a and 25a by bolts 60a that act as guides permitting the enclosure to be moved by the forces of flowing gas pressure and/or by the Z axis actuator along the Z axis relative to the lens system. Springs 60b exert a downward load force on the enclosure that tends to resist the pressure forces and, in effect, places a downward bias force (added to the weight of the enclosure) that must be overcome by the flowing gas static pressure against the bottom 1b of the enclosure to suspend or "float" the enclosure on the wafer. Clearly, the Z axis dimension between the surface 2a of the wafer and the objective lens system at mechanical ground is determined only by Z axis actuator stage 6, and the gap G between wafer surface 2a and the enclosure sealing surface 1b is determined by the flowing gas static pressure along surface 1b, the weight of the enclosure and the spring bias forces.

Hence, as shown in FIG. 1, flowing gas seal enclosure 1 is carried at the bottom of objective lens system 25 of the irradiation system by attachment thereto as described above. In this embodiment, the irradiation is intense far ultraviolet (UV) radiation from a pulsed excieer laser 31 (See FIG. 7) and objective lens system 25 is part of the irradiation system that focuses the radiation on the target at the wafer top surface. In this embodiment, objective lens system 25 may be attached to mechanical ground and since the gap G is controlled by the flowing gas pressure, the focal point of the UV radiation at 7 of the processed area 2c of the wafer surface 2a is tracked by wafer Z axis actuator stage 6.

The range of gap G may be 2 to 20 microns and is maintained ±0.2 microns in a typical case to effect a seal and at the same time a predetermined desired pressure is maintained in the processing chamber 3. For an APD process the excimer laser pulses of intense UV are precisely focused on the wafer surface (on a resist layer thereon) and this focus position of the wafer in the UV optical system must be maintained ±0.2 microns or the UV irradiated area will suffer a defocussing. Clearly, this is a Z axis variation of the target point that must be compensated for. It can be compensated for by an actuation of Z axis actuator 6 or by a change in the UV irradiation optical system 20. For that purpose, the Z axis position of the wafer top surface at the target with respect to mechanical ground is detected and an appropriate actuation is made by actuator 6 or by UV irradiation optical system 20, or both, to place the UV focus point at the target point. A suitable Z axis position detector system is described herein under the topic heading: "Automatic Focusing of Radiation On Wafer Target Surface".

Flowing Gas Seal Enclosure

Detailed cross section views of the gas seal assembly 8 including the suspended enclosure 1, the inserted wafer 2 and the wafer holding chuck 4 are shown in FIGS. 1, 3 and 5. The suspended enclosure 1 is essentially a hollowed cylinder (a figure of revolution) fabricated from metal or plastic. The top of this cylinder may be connected to the irradiation objective lens system 25 as described above, and the processing chamber 3 therein is closed and sealed hermeticallly on the top (facing the lens system) by UV transparent quartz window 8 against an appropriate O-ring seal 9. The processing chamber 3 is defined by a tapered hole through the cylinder that is a large area 1a at the top to accept all radiation from the objective lens system and is a small area 1c at the bottom to define the area 2c of the wafer surface at which the processing chamber is positioned to process.

The enclosure cylinder walls is drilled radially to provide passage 11 to inject a gas or gas mixture into chamber 3 or to evacuate the chamber. Similar radial passages 12 and 13 are provided that lead to inner and outer annular grooves 14 and 15, respectively, in the sealing surface (face) 1b of the enclosure. These sealing surface grooves 14 and 15 are provided for delivering or receiving gas evenly at their respective inner and outer radial positions around the center of the sealing surface 1b.

Groove 14 may receive gas (apply Vacuum) or may inject gas into the gap G, depending on the processing step, and so the pressure in groove 14 may be below or above ambient pressure, which is defined here as the pressure immediately outside the seal assembly 8. Usually, groove 15 only delivers gas to the gap G to insure that the total pressure in the gap is above ambient pressure an so gas flow is always out of the gap at its periphery to the surrounding ambient space. In all cases, the gas seal functions as an air bearing with a central chamber 3 in which the pressure can be controlled above or below ambient pressure by applying vacuum or gas pressure to the chamber via channel 11 and by applying gas pressure or vacuum to groove 14 and gas pressure to groove 15 in such a way that the gas seal floates with its sealing surface 1b a few microns above the wafer surface 2a.

The pressures in passages 11, 12 and 13 that lead to chamber 3, groove 14 ad groove 15, respectively, can be adjusted in such a way as to establish a certain desired pressure in chamber 3 adjacent area 2c of the wafer surface (see FIGS. 3 and 4), maintaining the functionality of the seal as an air bearing while being able to vary the gap G within a few microns. As a gas seal the gas flow between the chamber and the grooves are such that gases from the chamber cannot escape to the ambient space.

When the process step requires removal of particles, debris or gas from the chamber and particularly from the space in the chamber immediately adjacent the processed area 2c of wafer surface, functioning as a debris removal device, the gas flow in chamber 3 is such that gas flows toward the chamber from groove 4 and in an upward direction through the chamber and out of passage 11 to an exhaust or retrieval system. This is shown in FIGS. 5 and 6.

Process Chamber - Controlled Gas Pressure

Referring to FIGS. 1 and 2 and FIGS. 3 and 4, a processing gas supply system 16 is provided for delivering gas or a mixture of gases from any or all of gas containers 17a, 17b, 17c and 17d, fed via respective pressure regulators 18a to 18d to chamber flow regulator 19 that feeds the gas (injects the gas) at the desired pressure into chamber 3. Thus, the pressure and quality of the gas in the chamber and against area 2c of the wafer surface can be controlled by pressure regulators in gas mixing and supply system 16 such as shown in FIG. 3. Accurate gas composition in the case of mixtures, can also be controlled using mass flow meters in place of the pressure regulators shown. The gas or gas mixture enters chamber 3 flowing toward the wafer surface area 2c where reactions can be carried out with the influence of laser energy directed to that surface for purposes of etching, deposition, doping and annealing.

Excess process gas flows through the gap G in all radial directions toward groove 14 from which it is exhausted by exhaust system 21, which may include vacuum pump 21a and the exhaust may be filtered and recovered by filter 21b and gas recovery system 21c to prevent poisonous or corrosive process gases from entering the ambient space surrounding the equipment.

The process gas flowing out of chamber 3 through the gap causes the gas seal to function as an air bearing. The height of the gap G is a function of the process gas pressure in chamber 3 and the resulting flow of the gas through the gap G. In addition, an inert gas or air is pumped through groove 15 into the gas seal from pressure gas supply 22 and this gas exits from the outer periphery of the gap and also flows radially inward to groove 14 and is exhausted out of groove 14 with the processing gas by exhaust system 21. This gas supply system may include pressure pump 22a and pressure regulator 22b. The inert gas or air flow supplys the air bearing, and does not enter the processing chamber 3. In addition, it prevents process gas from entering the ambient space around the equipment.

If the pressure and therefore the gas flow through groove 15 is changed, G will also be changed. This control of G provides a technique of controlling focussing if the objective lens system 25 of the UV irradiation system 20 is carried on seal enclosure 1 and so is suspended (floats) with the enclosure. In that case the objective lens system would not be at mechanical ground and could be attached to the enclosure as shown in FIG. 1. Then, if the gap G is changed by changing the gas flow from system 22 into groove 15, by increasing or decreasing the gas supply pressure from system 22, the process gas flow to chamber 3 will also change somewhat. This difficulty can be overcome by a pressure sensor 23 connected to central chamber 3 to enable automatic compensation feedback control to process gas system 16.

FIG. 4 shows the approximate gas flow static pressure along any diametric line across the enclosure sealing surface 1b. In this Figure, the abscissa is the diametric line and is denoted radial position and is measured from the system optical axis 10. The ordinate in FIG. 4 is gage gas static pressure which is the net gas pressure acting upward on the enclosure and causing it to be suspended or float. Static pressure is defined herein as the total pressure of the gas less its dynamic head and is the pressure a gas flowing along a surface exerts on the surface. An integration of that static gage pressure over the bottom of the enclosure is the net upward force opposing the weight of the enclosure plus anything carried on it. So long as that net upward force equals the enclosure weight plus anything carried on it (such as objective lens system 25), the enclosure will float. Clearly, the greatest upward force of this static gas pressure is on the area of 1b between groove 15 and the outer periphery of 1b and that is controlled most directly by pressure air flow system 22.

Flowing Gas Seal Enclosure For Particle Removal

Referring to FIGS. 1 and 2 and FIGS. 5 and 6, in order to remove particles, gas, debris, etc. that may have been generated as a consequence of laser energy exposure of the surface 2c, an inert purging gas such as nitrogen or air is pumped into both grooves 14 and 15 from a purging system 24 that may include a source 24a of purging gas and a purging gas pressure pump 24b. The purging gas fed simultaneously into both grooves 14 and 15 will flow laterally as shown in FIG. 5. Part of the gas will exit the gas seal gap at its outer periphery to the ambient space and part will flow toward the center of the gas seal into chamber 3, aided by exhaust system 26 that may include a vacuum pump 26a that exhausts the chamber via passage 11 and dumps it into a recovery or discard container 26b.

Here, all gas flow through the seal gap G is purging gas and this flow of gas through gap G between surfaces 1b and 2a causes the gas seal to function as an air bearing. The flow of purging gas through chamber 3 of this gas seal is an upward flow which carries particles, debris, etc., which have been ejected from the surface 2c, after laser exposure, toward the exhaust system 26, thereby preventing contamination of the wafer surface by the ejected particles. By controlling the flow of purging gas into grooves 14 and 15 and by controlling the exhaust system 26 pressure, the gap G can be controlled. This is done using feedback from pressure sensor 23 connected to central chamber 3 to enable automatic compensation feedback control to exhaust system 26. Clearly, this control of G also provides a technique of controlling focussing if the objective lens system 25 of the UV irradiation system 20 is carried on seal enclosure 1 and so is suspended (floats) with the enclosure.

FIG. 6 shows the approximate gas flow static gage pressure along any diametric line across the enclosure sealing surface 1b for this operation. Here, as in FIG. 4, the abscissa is the diametric line and is denoted radial position and is measured from the system optical axis 10; and the ordinate is gas static gage pressure which is the net gas pressure acting upward on the enclosure and causing it to be suspended or float and an integration of that pressure over the bottom of the enclosure is the net upward force opposing the weight of the enclosure plus anything carried on it. So long as that net upward force equals the enclosure weight plus anything carried on it, the enclosure will float. Here, the greatest upward force of this static gas pressure is on the area of 1b between groove 14 and the outer periphery of 1b and that is easily controlled most directly by pressure air flow system 24.

UV Irradiation System And Focus Control

Figure 7:
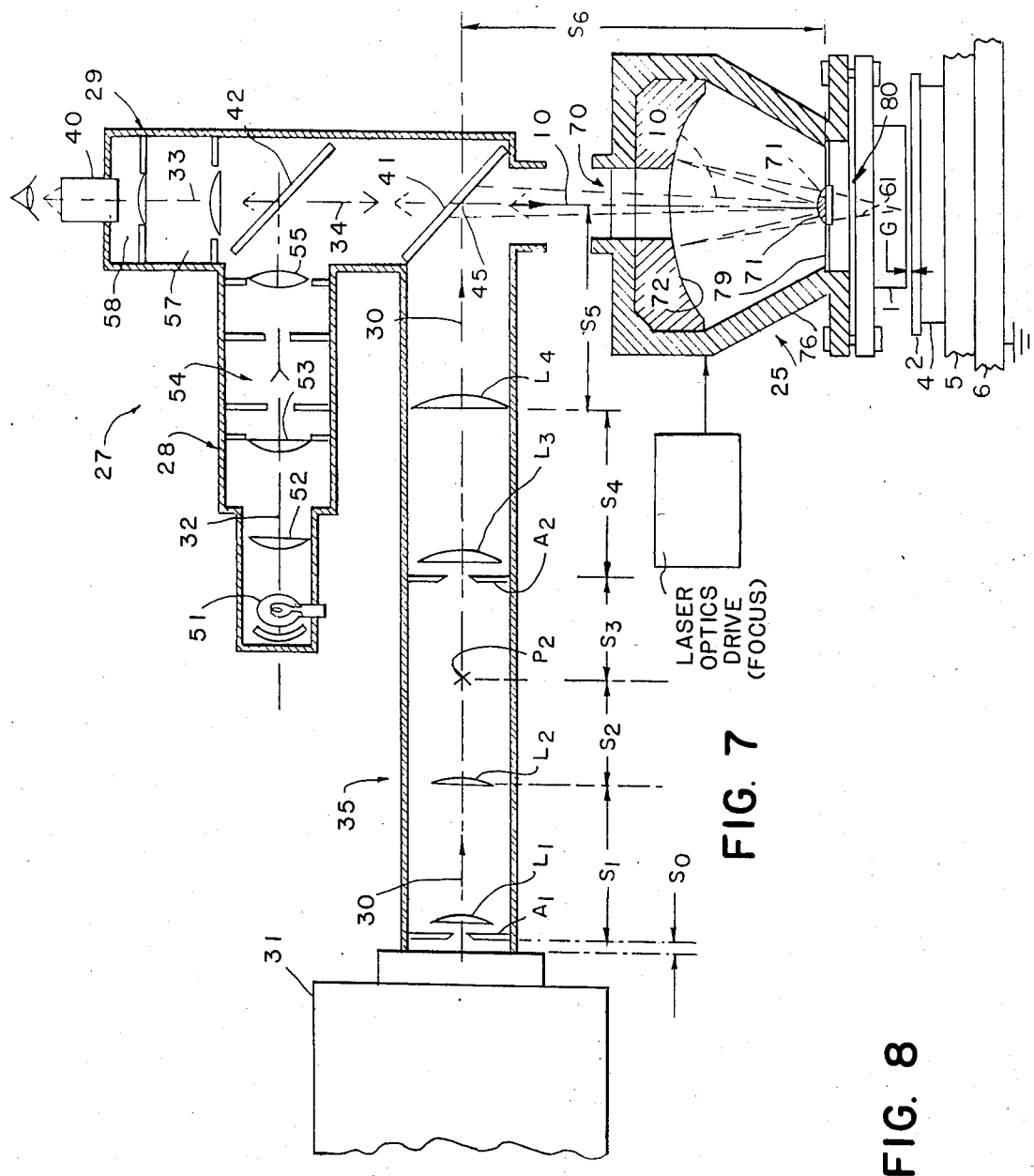
FIG. 7 is a schematic layout side view of an optical system for targeting the wafer surface in the flowing gas seal enclosure for any of the processes carried out with laser radiation while illuminating the target and surrounding area with visible light for viewing the processed area. The system includes an excimer laser producing intense far ultraviolet radiation, an optical system for directing the pulses to a reflecting objective lens system that focuses the laser pulses through the enclosure on the surface of the wafer, an optical detector for detecting the Z axis position of the wafer and producing a feedback signal to the wafer Z axis actuator stage to position the wafer target surface at the focal point of the radiation, and a visible light optical system incorporating part of the laser optical path, including the reflecting objective lens system, for illuminating the wafer surface with visible light, whereby the process (such as APD) on the wafer surface can be viewed and recorded as it occurs.

FIG. 7 is a schematic layout showing in cross section the significant optical and other parts of an optical system for UV irradiation of a target point on the wafer surface. This system includes a source of laser pulses, such as an argon-fluoride (ArFl) laser 31, producing pulses at 193 nm wavelength and fluence up to about 500 milijoules per square centimeter ($mJ/cm^2$) at a rate up to about 500 pulses per second.

The optical system 35 directs the laser beam issuing from Laser 31 along the optical system axis 30 to reflecting objective lens system 25 that focuses the laser beam on target point 7 of processed area 2c of the top surface 2a of wafer 2. For an APD process, at the target point 7, the wafer surface material is selectively removed, layer by layer, and the X and Y actuators in stage 5 move the wafer laterally with respect to optical axis 10, thereby moving the area of selective removal of material.

Illumination For Observation

Observation of some processes such as an APD process is desired. For that purpose, the wafer surface at area 2c around the target point 7 may be viewed by an observer through the visible light optical illumination and viewing system 27 that delivers visible light from part 28 thereof that is directed along axis 34 of system 27 to the optical axis 10 of objective lens system 25, to illuminate the wafer target area 2c and particularly the target point 7 and that illuminated area can be viewed through eyepiece 40 of the viewing part 29 of the system 27 along optical axis 34 that aligns directly with and includes the objective lens system optical axis 10.

Thus, visible light illuminating and viewing system 27 includes a part of the laser optical system. In particular, it includes objective lens system 25. The two systems merge at dichroic mirror 41 which incorporates a reflective layer interface which reflects far ultraviolet radiation incident thereon at 45, but transmits visible radiation. Hence, the laser beam along optical axis 10 is reflected by mirror 41 along axis 10 of reflecting objective lens system 25. At the same time, light from the illuminating portion 28 of system 27 is reflected by half silvered mirror 42 along visible light path 34 to dichroic mirror 41 and passes through that mirror along optical axis 10 into objective lens system 25 from which it is focused onto the target to illuminate an area thereof. As a result of this illumination, visible light reflected from the illuminated target area enters objective lens system 25 around small convex mirror 71 and is directed by the reflectors in 25 along axis 10 and through dichroic mirror 41 along visible light optical axis 34, through half silvered mirror 42 to eyepiece 40 where it can be viewed by an observer. Thus, eyepiece 40 and objective lens system 25 form a high resolution microscope for visible light and enable the observer to view the wafer surface during the APD process.

In a preferred embodiment, an operator observing the surface of the wafer and the target area thereof through eyepiece 40 may control the number of laser pulses fed into the system and the position of the wafer position in the plane of the X and Y axes. This is useful in an APD process as it enables control of the depth of removal accomplished by APD and the course of the ablation over the wafer surface may be controlled and observed by an operator.

The illuminating part 28 of system 27 includes a source of white light, such as an incandescent lamp 51, and along the optical axis 32 thereof, between the lamp and half silvered mirror 42, are lens 52, lens 53, aperture 54, and lens 55, in that order, all of which substantially direct the white light from source 51 as a parallel light beam to half silvered mirror 42. This visible light beam is directed from mirror 42 through dichroic mirror 41, along optical axis 10 of objective lens system 25 which focuses the visible light to illuminate the target area of the wafer. The illuminated target area is then viewed along optical axes 10, 34 and 33 through viewing lenses 57 and 58 and eyepiece 40.

Laser Beam Focusing Technique

There are several optical techniques of directing and focusing the laser beam onto the target using a reflecting objective lens system of the type described herein that has an obstructing aperture, the small convex mirror 71 and its obstructing lateral support arms 79. The preferred technique is the split beam technique described in said co-pending U.S. patent application Ser. No. 864,448. The beam from laser 21 is split into two halves that are displaced slightly laterally from axis 30 of the laser beam optical system and so the two halves (two separate beams) are reflected by dichroic mirror 41 along axis 10 of objective lens system 25, each displaced laterally to one side of that axis. In FIG. 7, the side view, one of these two beams (the one closer to the viewer) is represented by dash (broken) lines. The other beam is behind it. By positioning the two laser beams this way, the convex mirror lateral supports can be oriented between the beams.

Figure 8:
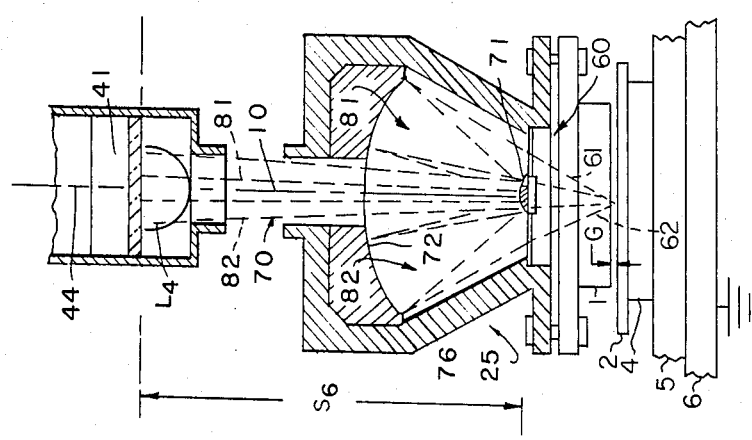
FIG. 8 is an end view of the same optical system showing only the reflecting objective lens system thereof, the flowing gas seal enclosure, the optical detector for detecting the Z axis position of the wafer target surface and the wafer Z axis actuator stage that responds to the optical detector, illustrating reflections in the objective lens system of the laser beam entering it as an aid to understanding the split-beam technique the optical detector for detecting the Z axis position of the wafer and the wafer Z axis actuator stage.

FIG. 8 is an end view of objective lens system 25 and part of the laser beam optical system. It shows both of the laser beams, each represented by a dash (broken) line and a dot-dash (broken) line that depict the outside rays of the beam. Laser beam 81 is on the right in FIG. 8 and beam 82 is on the left. They are essentially side-by-side from dichroic mirror 41 to convex reflector 71, and they impinge that reflector on opposite sides of the axis 10.

Figure 17:
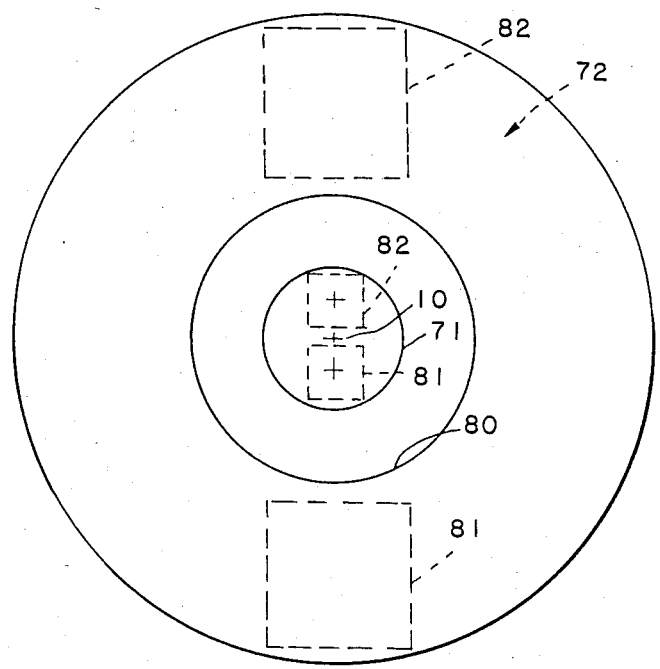
FIG. 17 is an enlarged top view of the reflecting objective lens system showing just the reflecting areas of the convex and the concave reflectors thereof, the entrance aperture at the center of the concave reflector for admitting the laser beams into the system and broken lines defining the spots on the reflectors impinged upon by the split laser beams.

FIG. 17 is an enlarged view taken along axis 10 showing the two reflectors 71 and 72 and the approximate areas of the reflectors illuminated by the two laser beams. As can be seen from these figures, the optics of objective lens system 25 and the spatial positioning, size and divergence of the two laser beams as they enter objective lens system 25 system at entrance aperture 70, that the outside rays of the beams (represented by dash and dot-dash lines) pass through the annular opening 80 at the bottom of the system defined by the inside of the housing 76 and convex mirror 71 and focus near the target 7 on the top surface of wafer 2.

Figure 18:
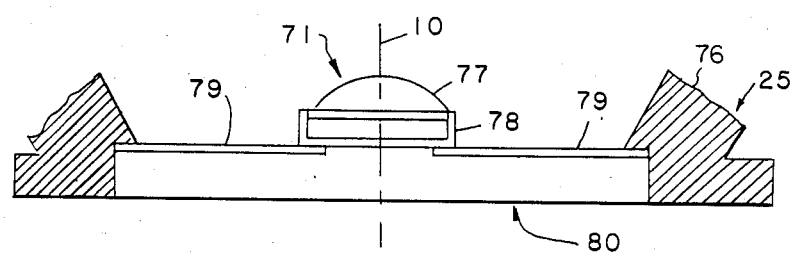
FIG. 18 is an enlarged side view of the convex reflector showing the support structure therefor and the side thereof that faces the target.

Convex mirror 71 of objective lens system 25 is subject to high fluence radiation pulses and so particular care must be taken in fabricating that reflector. FIG. 18 is an enlarged side view of reflector 71 showing its reflective surface 77 mounted in a holder 78 that is suspended by lateral support members (arms or wires) 79 secured to the opening 80 at the bottom of the system. The fluence of the beams where they impinge reflector 71 may be several times the fluence of the laser beam as it emerges from laser 31, and so the fluence at reflector 71 can be 5 J/cm$^2$.

A suitable reflector coating for 193 nm radiation is commercially available with a reflectance of 96% and better for zero degree angle of incidence, and it withstands repeated pulses at fluences of 5 J/cm$^2$. For example, there is a coating provided under the trade name "Suprasil", Coating #193FR" provided by Acton Research Corporation of Acton, Massachusetts that meets these requirements. This coating on an aluminum sub-coat is suitable for the use described herein. The "Suprasil" coating does not reflect visible light, however the aluminum sub-coat does. This is an advantage as it supports another feature of the present invention, described hereinabove, for illuminating the surface of the work piece with visible light so that it can be viewed by an observer as the ablation process occurs.

Laser Optical System Turning next to FIGS. 9 and 10, there are shown two views, a side view and a top view, of the laser rays, through the laser optical system 35 and into reflecting objective lens system 25. The formation of the split laser beam, the optical components of the system, and an explanation of the optical structures involved are described below in conjunction with FIGS. 11 through 18 also.

Turning first to FIG. 9, the same view of the laser optical system is shown as shown also in FIG. 7 and is referred to herein as the side view. It shows the relative positions of optical components of the system and illustrates the extreme rays of one of the beams. FIG. 10 is a top view and shows both of the beams. The objective lens system in FIG. 9 is a side view somewhat the same as the view in FIG. 7. However, FIG. 10 is not a top view of the objective lens system, but is an end view of that system similar to the view shown in FIG. 8, as it is more illustrative of the course of the rays through the reflecting objective lens system to the target.

Figure 11:
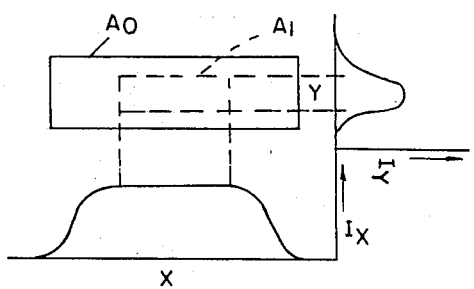
FIG. 11 depicts the cross section of the laser beam as it issues from the laser showing the distribution of radiation intensity in the beam cross section.
Figure 12:
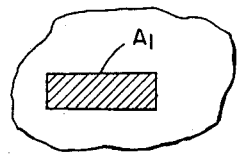
FIG. 12 shows the relative size of the cross section of the laser beam at the first aperture stop, whereby the cross section of the beam is reduced to that portion of the beam of nearly constant intensity in the cross section.

Lens L1 is a converging lens located near the exit aperture A1 which reduces the cross section of the laser beam launched into optical system 35 as explained with reference to FIGS. 11 and 12. FIG. 11 shows the initial cross section of the laser beam, A0, as it issues from the laser and may be 22 mm×6 mm and have a divergence of 2 to 4 milliradians. The intensity of the beam across the major and minor crosswise axes is represented as Ix and Iy plots in FIG. 11. The purpose of aperture A1 is to admit into the optical system 35 only the central section of the beam over which intensity is essentially uniform throughout.

Lens L1 forms a spot of very intense radiation at the focus of the lens equal in diameter to the focal length of the lens multiplied by the divergence angle of the laser beam. Between lens L1 and its focus is located lens L2 that images lens L1 onto aperture A3. Near the object to be illuminated is lens L3 that images the intermediate image formed by lens L1 onto the entrance pupil of the reflecting objective lens system, convex reflector 51. More particularly, this function is performed by lenses L2 and L3 in combination. As mentioned, in this case, the pupil of objective lens system 25 is convex reflector 71 and the area illuminated on the convex reflector is the obstructed portion of the aperture.

Lens L1 has a focal length for 193 nm radiation of 166 mm. Lens L2 focal length is 62.25 mm, and it is placed 75.6 mm beyond lens L1. The divergent laser beam is focused by lens L1 at 166 mm beyond lens L1 to a spot 0.664 mm by 1.33 mm. Lens L2 re-images this spot to point P2 which is a distance 36.9 mm beyond lens L2 and the spot size at point P2 is 0.27 mm ×0.54 mm. Lens L2 images lens L1 at a point 353 mm beyond lens L2, and the image of L1 is magnified 4.66 times. This image of L1 is the aperture A3 to be illuminated. The lenses L3 and L4 are placed to image the image from point P2 onto the objective lens system aperture (convex reflector 71).

All that is described above with reference to FIG. 9 pertains to each of the beams that are split from the initial laser beam. FIG. 10, the top view of the optical system, shows the two beams 81 and 82. These beams are initially split from the radiation emerging from aperture A1 and shown in FIG. 12. Lenses L1 and L2 accomplish this split. Each of these lenses is split into halves, and the halves are displaced laterally from each other. As a result, aperture A3 is illuminated by two separate laser beams, 81 and 82, which come into aperture A3 in different directions and arise from adjacent areas of the initial laser beam.

Figure 13:
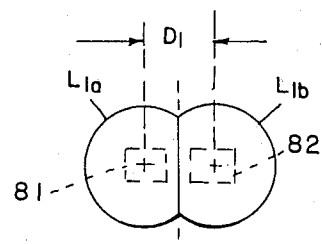
FIGS. 13 and 14 are axial and top views, respectively, of the first split lens L1 of the optical system.
Figure 14:
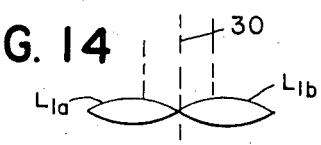

The median ring of the unobstructed portions of objective lens system 25 is at about numerical aperture equal to 0.36. The magnification of the object is 36 times, and so a ray from the center of aperture A3 to this median ring will make an angle of about 0.01 radians to the axis. A ray at this angle will intersect lens L2 at a distance of about 3.53 mm from the axis. The regions of lens L1 to be imaged at aperture A3 are taken to be 3 millimeters square and are both adjacent to the axis. For a ray from the center of a 3 mm square (1.5 mm off axis) to pass lens L2 at 3.53 mm off axis, the split lenses of L1 must be displaced laterally by a distance of about 5.95 mm. Thus, lens L1 is made in two parts as shown by FIGS. 13 and 14. FIG. 13 shows the two parts, L1a and L1b, each with an optical center displaced a distance D1 which is equal to 5.95 mm laterally away from the axis 30.

Figure 15:
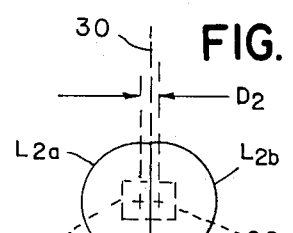
FIGS. 15 and 16 are axial and top views, respectively, of the second split lens, L2, of the optical system.
Figure 16:
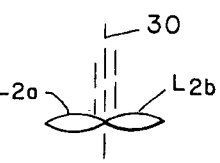

Lens L2 is also split into decentered parts, as shown in FIGS. 15 and 16. Here, the two parts L2a and L2b are decentered from the axis 10 and so are spaced apart a dimension D2. Dimension D2 is such that a point 1.5 mm off axis at lens L1 is imaged on axis at point P2. In this example, the amount of decentration (dimension D2) is about 1.235 mm.

To image the laser beam onto the reflecting objective lens system 25 convex reflector 71, requires a lens of focal length of 115 mm. The illuminated spots of each of the laser beams 81 and 62 on the objective would then be 0.15 mm×0.13 mm, and this would be too high a fluence or flux density at the convex reflector and would probably damage or destroy the reflective coating. Instead, point P2 is focused about 27 mm beyond convex mirror 71, and so lens L3 has a focal length of about 125 mm or greater, and its position may be adjusted by trial and error to ensure that the fluence of the beams on the convex mirror 71 are not excessive. It is preferred that the illuminated spots on convex mirror 71, as shown in FIG. 17, are each about 1.625 mm by 1.75 mm; and, of course, the illuminated spots on the large concave reflector 72 are much larger and consequently of much lower fluence.

At lens L1, the fluence of the pulses of laser radiation are essentially the same as the output of the laser and may be typically on the order of a few up to 500 mJ/cm$^2$. At lens L2 the fluence is higher than at the laser by a factor of about three. At aperture A3 the fluence of each of the beams is about 8% of what it is at the laser output. Finally, at the objective convex reflector 71, the fluence is about 1.36 times the fluence at the output of the laser. This is then focused by large concave reflector 72 onto the target 7, producing at the target a fluence eighty to one hundred, or more, times the laser output fluence and sufficient to cause useful ablative photodecomposition of the target material.

Automatic Focusing of Radiation On Wafer Target Surface

An automatic focusing system, sometimes called an autofocus system, that s presently available in commerce, uses an infra-red (IR) light beam emanating from a laser diode having a wavelength of 904 nm. That IR beam through a small illuminating aperture is directed to the target surface, reflects from the surface and is detected by an IR detecting diode looking through a small detecting aperture. Any change in the position of the surface relative to the diodes and their apertures changes the optical alignment of the two diodes which is manifest in a change in the electrical output of the detecting diode. Such an automatic focus detection system may be carried within visible light viewing system 27 as shown in FIG. 7 in a manner to detect any change in the position of the target on the wafer surface along the optical axis of objective lens system 25. The signal produced by the detecting diode represents that change in position and can be used as a feedback signal to initiate a correction either to change the wafer position or to change focus of the UV irradiation system. A suitable autofocus system of this type is available from E Leitz, Inc of Wetzlas, West Germany under the tradename LAF (laser autofocus).

An automatic focusing system, like the LAF autofocus system, may be used with the flowing gas seal structures of the present invention as illustrated in FIG. 7. Here it serves to detect any change in the position of wafer target area 2c and, in particular the target point 7, along the optical axis 10 with respect to the position of objective lens system 25 along that axis. The emitting (illuminating) diode 91 through its illuminating aperture 92 and the detecting diode 93 looking through its detecting aperture 94 are all located in the UV and visible optical system 20 at mechanical ground. For example, these diodes and their apertures are located off the axis 34 of visible light optical system 27 equally placed on opposite sides of that axis, and they view the target through objective lens system 25 just as the visible light. At only one position of the target point 7 along axis 10 will the IR radiation detected by the detecting diode be greatest.

The detected change in the position of the target point 7 along axis 10 is represented by a signal from detecting diode 93 and is a feedback signal and is applied either to change the position of the wafer surface along axis 10 or to change the focus. The focus of UV radiation may be corrected by adjusting (moving) a lens of the UV optical system 35. Some slight adjustment of focus may also be made by adjusting the seal gas flow pressure to change the gap G, as described herein with reference to FIGS. 3 or 5. In this way, an automatic null type focusing system is provided.

Conclusions

. Features of the present invention are applicable to provide a controlled gas environment against a surface of a workpiece for performing a process on the surface that requires the gas environment. The particular embodiments of the present invention described herein can be used to perform many key dry processes in the manufacture of integrated circuits on a semiconductor wafer and particularly those processes that require a controlled gas environment at the processed surface of the wafer and gas processes that are radiation induced and/or where debris generated by the impingement of laser energy on the surface must be removed; and, at the same time, it is desired that the process be viewed by an observer who may control the position of the target area of the wafer surface. Clearly, features of this total system with some modifications may be employed to form other embodiments of the invention to perform other dry processes, such as other processes in the fabrication of integrated circuits that are not radiation induced, but require a controlled gas environment and a flowing gas seal that avoids the use of static gas seals that must be opened and closed for every process. Other embodiments will be apparent to those skilled in the art without departing from the spirit and scope of the invention as set forth in the appended claims.

What is claimed is:

1. Apparatus for processing a surface of a substrate body comprising,
   (a) means for holding said substrate body with said surface exposed,
   (b) an enclosure providing a processing chamber for said exposed substrate surface, positioned adjacent a portion of said exposed substrate surface,
   (c) said enclosure having an annular portion thereof that encircles said processing chamber and is spaced from said exposed substrate surface providing a flowing gas seal gap therebetween and
   (d) gas flow control means for controlling gas flow through said flowing gas seal,
   (e) whereby said processing chamber and said portion of said substrate body exposed surface that is adjacent said processing chamber are exposed to gas at conditions determined by said control means.

2. Apparatus as in claim 1 wherein,
   (a) a platform is provided for said substrate holding means and
   (b) means are provided on said platform for moving said holding means to vary said flowing gas seal gap.

3. Apparatus as in claim 1 wherein,
   (a) a gas flow conduit is provided between said gas flow control means and said processing chamber.

4. Apparatus as in claim 1 wherein,
   (a) said annular portion of said enclosure that encircles said processing chamber and is spaced from said exposed substrate surface providing a flowing gas seal gap therebetween is flat and parallel to said exposed substrate surface and separated therefrom by said gap and
   (b) said gap is less than 100 microns.

5. Apparatus as in claim 1 wherein,
   (a) said annular portion of said enclosure that encircles said processing chamber and is spaced from said exposed substrate surface providing a flowing gas seal gap therebetween is flat and parallel to said exposed substrate surface and separated therefrom by said gap and
   (b) within said annular portion of said enclosure is an annular chamber defined by a wall thereof that is essentially parallel to said exposed substrate surface and spaced therefrom a distance that is substantially greater than said gap.

6. Apparatus as in claim 5 wherein,
   (a) a gas flow conduit is provided between said gas flow control means and said annular chamber.

7. Apparatus as in claim 1 wherein,
   (a) said annular portion of said enclosure that encircles said processing chamber and is spaced from said exposed substrate surface providing a flowing gas seal gap therebetween is flat and parallel to said exposed substrate surface and separated therefrom by said gap and
   (b) within said annular portion of said enclosure several concentric annular chambers each defined by a wall thereof that is essentially parallel to said exposed substrate surface and spaced therefrom a distance that is substantially greater than said gap.

8. Apparatus as in claim 7 wherein,
   (a) a gas flow conduit is provided between said gas flow control means and one of said annular chambers.

9. Apparatus as in claim 8 wherein,
   (a) said gas flow conduit is between said gas flow control means and the inner one of said annular chambers.

10. Apparatus as in claim 2 wherein,
    (a) said annular portion of said enclosure that encircles said processing chamber and is spaced from said exposed substrate surface providing a flowing gas seal gap therebetween is flat and parallel to said exposed substrate surface and separated therefrom by said gap and
    (b) within said annular portion of said enclosure is an annular chamber defined by a wall thereof that is essentially parallel to said exposed substrate surface and spaced therefrom a distance that is substantially greater than said gap.

11. Apparatus as in claim 10 wherein,
    (a) a gas flow conduit is provided between said gas flow control means and said annular chamber.

12. Apparatus as in claim 2 wherein,
    (a) said annular portion of said enclosure that encircles said processing chamber and is spaced from said exposed substrate surface providing a flowing gas seal gap therebetween is flat and parallel to said exposed substrate surface and separated therefrom by said gap and
    (b) within said annular portion of said enclosure several concentric annular chambers each defined by a wall thereof that is essentially parallel to said exposed substrate surface and spaced therefrom a distance that is substantially greater than said gap.

13. Apparatus as in claim 12 wherein,
    (a) a gas flow conduit is provided between said gas flow control means and one of said annular chambers.

14. Apparatus as in claim 13 wherein,
    (a) said gas flow conduit is between said gas flow control means and the inner one of said annular chambers.

15. Apparatus as in claim 1 wherein,
    (a) said substrate exposed surface is horizontal and
    (b) said enclosure is suspended above said substrate exposed surface.

16. Apparatus as in claim 15 wherein,
    (a) a platform is provided for said substrate holding means below said substrate holding means.

17. Apparatus as in claim 16 wherein,
    (a) means are provided on said platform for moving said holding means to vary said flowing gas seal gap.

18. Apparatus as in claim 15 wherein,
    (a) means are provided for supporting said substrate holding means and
    (b) means are provided for moving said holding means on said supporting means to change said encircled portion of said substrate exposed surface.

19. Apparatus as in claim 18 wherein,
    (a) said encircled portion of said substrate exposed surface has a geometric center and
    (b) moving said holding means moves said geometric center in the horizontal plane of said exposed surface.

20. Apparatus as in claim 1 wherein,
(a) said substrate exposed surface is horizontal,
(b) said enclosure is suspended above said substrate exposed surface,
(c) a platform is provided for said substrate holding means below said substrate holding means,
(d) means are provided on said platform for moving said holding means to vary said flowing gas seal gap,
(e) means are provided for supporting said platform and moving said said platform to change said encircled portion of said substrate exposed surface.
(f) whereby said substrate exposed surface is moveable with respect to said enclosure along X, Y and Z directions of cartesian coordinales of which X and Y are in the horizontal plane and said gap dimension is in the Z direction 21. Apparatus for processing a surface of a substrate body comprising;
(a) means for holding said substrate body with said surface exposed,
(b) an enclosure providing a processing chamber for said exposed substrate surface, positioned adjacent a portion of said exposed substrate surface
(c) said enclosure having an annular portion thereof that encircles said processing chamber and is spaced from said exposed substrate surface providing a flowing gas seal gap therebetween,
(d) gas flow control means for controlling gas flow through said flowing gas seal,
(e) whereby said processing chamber and said portion of said substrate body exposed surface that is adjacent said processing chamber are exposed to gas at conditions determined by said control means.
(f) a source of radiation producing a beam of directional radiation of intensity $I_0$,
(g) a window in said enclosure transparent to said radiation and bounding said processing chamber
(h) an objective lens system for said beam of radiation immediately adjacent to said enclosure window, the optical axis of said objective lens system being essentially normal to the plane of said substrate exposed surface, and
(i) optical means defining an optical path for said radiation beam between said source of radiation and said objective lens system,
(j) whereby said objective lens system focuses said beam on said enclosed portion of said exposed substrate surface to an intensity $I_t$, which is substantially greater than $I_0$.

22. Apparatus as in claim 21 wherein,
(a) said objective lens system includes two reflectors facing each other on said optical axis, a large concave reflector and a small convex reflector, and
(b) said beam radiation is incident first on said small convex reflector and then on said large concave reflector which focuses said radiation on said enclosed portion of said exposed substrate surface to said intensity $I_t$.

23. Apparatus as in claim 22 wherein,
(a) said large concave reflector has an entrance aperture at the center thereof concentric with said optical axis,
(b) whereby said beam first enters said objective lens system through said entrance aperture.

24. Apparatus as in claim 23 wherein,
(a) substantially all of said beam that enters said reflecting objective lens system through said entrance aperture in said large concave reflector thereof impinges on said small convex reflector and is reflected therefrom to said large concave reflector and reflects therefrom through said enclosure window to said enclosed portion of said exposed substrate surface to said intensity $I_t$.

25. Apparatus as in claim 23 including,
(a) means in said optical system and the optical path thereof between said laser and said reflecting objective lens system for dividing said laser beam into separate beams along separate paths and
(b) means for directing said separate beams through said entrance aperture in said large concave reflector to opposite sides of the center of said small convex reflector,
(c) whereby said separate beams reflect from said small convex reflector to said large concave reflector and reflect therefrom to the same area on said enclosed portion of said exposed substrate surface to said intensity $I_t$.

26. Apparatus as in claim 25 wherein,
(a) said separate beams cross at the same point on said said enclosed portion of said exposed substrate surface to said intensity $I_t$.

27. Apparatus as in claim 25 wherein,
(a) said separate beams are substantially the same cross-section shape and size.

28. Apparatus as in claim 25 wherein,
(a) said separate beams cross at the same point on said enclosed portion of said exposed substrate surface to said intensity $I_t$ and
(b) said separate beams are the same cross-section shape and size at said point of crossing.

29. Apparatus as in claim 28 wherein,
(a) the cross sections of said separate beams are in registration at said point of crossing.

30. Apparatus as in claim 29 wherein,
(a) means are provided for making the optical lengths of said separate paths, in terms of the wavelength of said radiation, different,
(b) whereby the wave fronts of said separate beams at said point of crossing are not in the same phase.

31. Apparatus as in claim 21 further including,
(a) a source of visible light,
(b) means for directing said visible light to said objective lens system through said aperture in said concave reflector thereof,
(c) whereby said visible light illuminates said enclosed portion of said exposed substrate surface and
(d) visible light optical means, including an eyepiece for viewing said enclosed portion of said exposed substrate surface through said objective lens system.

32. Apparatus as in claim 31 wherein,
(a) said objective lens system reflectors substantially reflect visible light as well as said beam of radiation.

33. Apparatus as in claim 32 wherein,
(a) said objective lens system reflectors are coated with a layer of material that reflects said beam radiation and with a layer of material that reflects visible light.

34. Apparatus as in claim 33 wherein,
(a) visible light that reflects from said enclosed portion of said exposed substrate surface to said large concave reflector and therefrom to said small convex reflector eerges from said entrance aperture and is directed by said visible light optical means to said eyepiece.

35. Apparatus for processing a surface of a substrate body causing ablative photodecomposition at said surface by pulsed far-ultraviolet laser radiation from a source of such laser radiation pulses of fluence $F_0$, the improvement comprising, comprising;
(a) means for holding said substrate body with said surface exposed,
(b) an enclosure providing a processing chamber for said exposed substrate surface, positioned adjacent a portion of said exposed substrate surface,
(c) said enclosure having an annular portion thereof that encircles said processing chamber and is spaced from said exposed substrate surface providing a flowing gas seal gap therebetween,
(d) gas flow control means for controlling gas flow through said flowing gas seal,
(e) whereby said processing chamber and said portion of said substrate body exposed surface that is adjacent said processing chamber are exposed to gas at conditions determined by said control means,
(f) a source of said laser radiation,
(g) a window in said enclosure transparent to said laser radiation, bounding said processing chamber therein,
(h) a reflecting objective lens system immediately adjacent to said window, the optical axis of said reflecting objective lens system being essentially normal to the plane of said enclosed portion of said substrate body exposed surface and
(i) optical means defining an optical path for said laser beam between said source of laser radiation and said reflecting objective lens system,
(j) whereby said reflecting objective lens system focuses said laser beam on said enclosed portion of said substrate body exposed surface that is adjacent said processing chamber to a pulse fluence $F_t$ which is substantially greater than $F_0$.

36. Apparatus as in claim 35 wherein,
(a) said reflecting objective lens system includes two reflectors facing each other on said optical axis, a large concave reflector and a small convex reflector, and
(b) said beam radiation is incident first on said small convex reflector and then on said large concave reflector which focuses said radiation on said enclosed portion of said substrate body exposed surface.

37. Apparatus as in claim 36 wherein,
(a) said large concave reflector has an entrance aperture at the center thereof concentric with said optical axis,
(b) whereby said laser beam first enters said reflecting objective lens system through said entrance aperture.

38. Apparatus as in claim 37 wherein,
(a) means in said optical system and the optical path thereof between said laser and said reflecting objective lens system for dividing said laser beam into separate beams along separate paths and
(b) means for directing said separate beams through said hole in said large concave reflector to opposite sides of the center of said small convex reflector,
(c) whereby said separate beams reflect from said small convex reflector to said large concave reflector and reflect therefrom to the same point on said enclosed portion of said substrate body exposed surface.

39. Apparatus as in claim 38 wherein,
(a) said separate beams cross at the same point on said enclosed portion of said substrate body exposed surface and
(b) said separate beams are the same cross-section shape and size at said point of crossing.

40. Apparatus as in claim 35 wherein
(a) a source of visible light,
(b) means for directing said visible light to said reflecting objective lens system through said entrance aperture in said concave reflector thereof,
(c) whereby said visible light illuminates said enclosed portion of said substrate body exposed surface and
(d) visible light optical means, including an eyepiece for viewing said enclosed portion of said substrate body exposed surface through said entrance aperture in said large concave reflector.

41. Apparatus as in claim 40 wherein,
(a) said reflecting objective lens system reflectors substantially reflect visible light as well as said laser radiation.

42. Apparatus as in claim 40 wherein,
(a) said reflecting objective lens system reflectors are coated with a layer of material that reflects said laser radiation and with a layer of material that reflects visible light.

43. Apparatus for processing a surface of a substrate body causing ablative photodecomposition at said surface by pulsed far-ultraviolet laser radiation from a source of such laser radiation pulses of fluence $F_0$, the improvement comprising, comprising,
(a) means for holding said substrate body with said surface exposed,
(b) an enclosure providing a processing chamber for said exposed substrate surface, positioned adjacent a portion of said exposed substrate surface,
(c) said enclosure having an annular portion thereof that encircles said processing chamber and is spaced from said exposed substrate surface providing a flowing gas seal gap therebetween,
(d) gas flow control means for controlling gas flow through said flowing gas seal,
(e) whereby said processing chamber and said portion of said substrate body exposed surface that is adjacent said processing chamber are exposed to gas at conditions determined by said control means,
(f) a source of said laser radiation,
(g) a window in said enclosure transparent to said laser radiation, bounding said processing chamber therein,
(h) an objective lens system immediately adjacent to the work piece surface, the optical axis of said reflecting objective lens system being essentially normal to the plane of said work piece surface,
(i) optical means defining an optical path for said laser beam between said source of laser radiation and said objective lens system,
(j) whereby said reflecting objective lens system focuses said laser beam on said work piece surface to a pulse fluence $F_t$ which is substantially greater than $F_0$,
(k) a source of visible light,
(l) means for directing said visible light to said objective lens system, (m) whereby said visible light illuminates said work piece surface and (n) visible light optical means, including an eyepiece for viewing said work piece surface through said objective lens system.

44. A method of processing a surface of a substrate body comprising the steps of:
(a) holding said substrate body with said surface exposed,
(b) enclosing a portion of said exposed surface with an enclosure providing a processing chamber for said said portion of said exposed substrate surface, positioned adjacent said portion of said exposed substrate surface,
(c) positioning said substrate body so that an annular portion thereof that encircles said processing chamber is parallel to and spaced from said exposed substrate surface to provide a flowing gas seal gap therebetween and
(d) imposing a gas pressure differential across said flowing gas seal,
(e) whereby said processing chamber and said portion of said substrate body exposed surface that is adjacent said processing chamber are exposed to gas at one of said imposed gas pressures.

45. A method as in claim 44 including the step of:
(a) moving said holding means to vary said flowing gas seal gap.

46. A method as in claim 44 including the step of:
(a) controlling said gas composition.

47. A method as in claim 44 including the step of: (a) controlling said gas temperature.

48. A method as in claim 44 including the step of:
(a) moving said substrate body to change said encircled portion of said substrate exposed surface.

49. A method as in claim 44 including the steps of:
(a) moving said substrate body with respect to said enclosure along X, Y and Z directions of cartesian coordinates fixed to said enclosure, of which X and Y are in the plane of said substrate surface and said gap dimension is in the Z direction.

50. A method of selectively removing material from a workpiece surface by ablative photodecomposition of the material by a pulsed beam of far-ultraviolet laser radiation from a source of such laser radiation pulses of fluence $F_0$, including the steps of:
(a) holding said substrate body with said surface exposed,
(b) enclosing a portion of said exposed surface with an enclosure providing a processing chamber for said said portion of said exposed substrate surface, positioned adjacent said portion of said exposed substrate surface,
(c) positioning said substrate body so that an annular portion thereof that encircles said processing chamber is parallel to and spaced from said exposed substrate surface to provide a flowing gas seal gap therebetween and
(d) imposing a gas pressure differential across said flowing gas seal,
(e) whereby said processing chamber and said portion of said substrate body exposed surface that is adjacent said processing chamber are exposed to gas at one of said imposed gas pressures.
(f) intercepting said far-ultraviolet laser radiation beam by a first relatively small convex reflector that is adjacent to said enclosure, the optical axis of said first reflector being essentially normal to the plane of said substrate surface and the reflective face thereof facing away from said substrate surface and
(g) intercepting said far-ultraviolet laser radiation beam that reflects from said first reflector by a second relatively large diameter concave reflector that is optically between said first reflector and said laser, the optical axis of said second reflector being essentially coincident with the optical axis of said first and the reflective face thereof facing toward said substrate surface
(h) whereby said reflectors focus said laser radiation pulses on said surface to a pulse fluence $F_t$ which is substantially greater than $F_0$.

51. A method as in claim 50 wherein before step (f),
(f1) dividing said laser beam into separate beams along separate paths and
(f2) then directing said separate beams through said entrance aperture to opposite sides of the center of said first convex reflector,
(f3) whereby said separate beams are focused on the same point on said enclosed portion of said substrate surface.

52. A method as in claim 51 wherein,
(ff1) in said step (f1) said laser beam is divided into two separate beams of equal intensity and equal cross section dimensions,
(ff2) whereby said separate beams are the same cross-section shape, size and intensity where they are focused on said point on said enclosed portion of said substrate surface.

53. Apparatus as in claim 32 wherein,
(a) a focus detection system is provided including a radiation emitter and a radiation detector, emitting and detecting non-visible radiation,
(b) said emitter and said detector are located that non-visible radiation from said emitter enters said objective lens system and reflects from said exposed substrate surface through said objective lens system to said detector and
(c) said detector produces an electrical signal indicative of the position of said surface with respect to the focal point of said UV radiation.

54. Apparatus as in claim 53 wherein,
(a) said non-visible radiation is in the infra-red spectrum.

55. Apparatus as in claim 53 wherein,
(a) means are provided for moving said substrate in response to said electrical signal.

56. Apparatus as in claim 53 wherein,
(a) means are provided for changing said optical means in response to said electrical signal.

* * * * *